(12) United States Patent
Saroka

(10) Patent No.: US 12,526,968 B2
(45) Date of Patent: Jan. 13, 2026

(54) HEATSINK FOR POWER ELECTRONICS COOLING

(71) Applicant: Carrier Corporation, Palm Beach Gardens, FL (US)

(72) Inventor: Mary D. Saroka, Syracuse, NY (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 422 days.

(21) Appl. No.: 18/150,458

(22) Filed: Jan. 5, 2023

(65) Prior Publication Data

US 2023/0217634 A1 Jul. 6, 2023

Related U.S. Application Data

(60) Provisional application No. 63/296,954, filed on Jan. 6, 2022.

(51) Int. Cl.
| | |
|---|---|
| *G06F 1/16* | (2006.01) |
| *H02K 9/22* | (2006.01) |
| *H05K 5/00* | (2025.01) |
| *H05K 7/00* | (2006.01) |
| *H05K 7/20* | (2006.01) |

(52) U.S. Cl.
CPC ......... *H05K 7/20936* (2013.01); *H02K 9/227* (2021.01); *H05K 7/20881* (2013.01)

(58) Field of Classification Search
CPC . H05K 7/20936; H05K 7/20881; H02K 9/227
See application file for complete search history.

(56) References Cited

U.S. PATENT DOCUMENTS

| | | | |
|---|---|---|---|
| 5,471,850 A * | 12/1995 | Cowans | F25B 1/10 |
| | | | 62/223 |
| 6,116,040 A | 9/2000 | Stark | |
| 6,397,618 B1 | 6/2002 | Chu et al. | |
| 6,526,768 B2 | 3/2003 | Wall et al. | |
| 6,543,246 B2 | 4/2003 | Wayburn et al. | |
| 6,560,980 B2 * | 5/2003 | Gustafson | F25B 49/02 |
| | | | 62/186 |
| 6,687,122 B2 | 2/2004 | Monfarad | |
| 6,687,125 B2 | 2/2004 | Park et al. | |
| 6,741,469 B1 | 5/2004 | Monfarad | |
| 7,342,787 B1 | 3/2008 | Bhatia | |

(Continued)

FOREIGN PATENT DOCUMENTS

| | | |
|---|---|---|
| CN | 103732993 A | 4/2014 |
| CN | 109341172 A | 2/2019 |

(Continued)

OTHER PUBLICATIONS

Extended European Search Report for European Application No. 23150518.1; Report Mail Date Jun. 2, 2023 (7 Pages).

*Primary Examiner* — Anthony M Haughton

(74) *Attorney, Agent, or Firm* — CANTOR COLBURN LLP

(57) ABSTRACT

A refrigeration unit including a refrigeration circuit, a mounting plate, a power electronics device thermally coupled to the mounting plate, and a heat sink thermally coupled to the mounting plate and to a component of the refrigeration circuit. The heat sink is configured to transfer waste heat from the mounting plate to the component of the refrigeration circuit.

14 Claims, 7 Drawing Sheets

(56) References Cited

U.S. PATENT DOCUMENTS

| | | | |
|---|---|---|---|
| 7,726,145 B2 | 6/2010 | Nakamura | |
| 8,947,873 B2 * | 2/2015 | Campbell | H05K 7/20336 |
| | | | 361/679.52 |
| 9,032,753 B2 | 5/2015 | Love et al. | |
| 9,395,106 B2 * | 7/2016 | Voorhis | F25B 31/006 |
| 9,429,151 B2 | 8/2016 | Taras et al. | |
| 10,314,200 B2 | 6/2019 | Sykora et al. | |
| 10,371,396 B2 | 8/2019 | Chi et al. | |
| 10,508,841 B2 | 12/2019 | Roth | |
| 10,895,389 B2 | 1/2021 | Abe et al. | |
| 10,976,062 B2 | 4/2021 | Wang et al. | |
| 11,516,944 B1 * | 11/2022 | Gao | H05K 7/208 |
| 2001/0017039 A1 | 8/2001 | Weimer | |
| 2009/0090113 A1 | 4/2009 | Caillat | |
| 2014/0305153 A1 | 10/2014 | Arai | |
| 2017/0127566 A1 | 5/2017 | Imura et al. | |
| 2018/0010836 A1 | 1/2018 | Hirahara et al. | |

FOREIGN PATENT DOCUMENTS

| | | | |
|---|---|---|---|
| EP | 2146151 A1 | 1/2010 |
| FR | 3086888 A1 | 4/2020 |
| KR | 20120042343 A | 5/2012 |
| WO | 2021022192 A1 | 2/2021 |

\* cited by examiner

HEATSINK FOR POWER ELECTRONICS COOLING

CROSS-REFERENCE TO RELATED APPLICATIONS

This application claims the benefit of U.S. Provisional Application No. 63/296,954 filed Jan. 6, 2022, the disclosure of which is incorporated herein by reference in its entirety.

BACKGROUND

Exemplary embodiments pertain to the art of refrigeration systems, and more particularly, the present disclosure relates to cooling power electronics of a refrigeration system.

Power electronic devices such as motor drives can generate waste heat during operation based on the efficiency of the device. Additionally, when the power electronic devices heat up beyond some upper temperature limit, their efficiency can degrade. When configured into a refrigeration system, effective thermal integration of these devices can be an important aspect to the system's overall efficiency and reliability. Accordingly, there is a need to provide effective cooling to these power electronic devices.

BRIEF DESCRIPTION

According to an embodiment, a refrigeration unit including a refrigeration circuit, a mounting plate, a power electronics device thermally coupled to the mounting plate, and a heat sink thermally coupled to the mounting plate and to a component of the refrigeration circuit. The heat sink is configured to transfer waste heat from the mounting plate to the component of the refrigeration circuit.

In addition to one or more of the features described herein, or as an alternative, in further embodiments the refrigeration circuit further comprises a compressor having a suction inlet and a suction tube arranged within a clearance formed between the mounting plate and the compressor, the suction tube being fluidly connected to the suction inlet, wherein the heat sink is thermally coupled to the suction tube.

In addition to one or more of the features described herein, or as an alternative, in further embodiments the suction tube includes at least one linear section and the heat sink is thermally coupled to the at least one linear section.

In addition to one or more of the features described herein, or as an alternative, in further embodiments the at least one linear section is oriented parallel to the mounting plate.

In addition to one or more of the features described herein, or as an alternative, in further embodiments the at least one linear section is vertically oriented.

In addition to one or more of the features described herein, or as an alternative, in further embodiments the suction tube includes a plurality of linear sections and the heat sink is thermally coupled to at least one of the plurality of linear sections.

In addition to one or more of the features described herein, or as an alternative, in further embodiments the mounting plate includes a first surface and a second surface, the power electronics module being thermally coupled to the first surface and the heat sink being thermally coupled to the second surface.

In addition to one or more of the features described herein, or as an alternative, in further embodiments the heat sink has a first end and a second end, the first end being mechanically and thermally coupled to a surface of the mounting plate.

In addition to one or more of the features described herein, or as an alternative, in further embodiments the surface of the mounting plate has at least one recess formed therein and the first end of the heat sink is arranged within the at least one recess.

In addition to one or more of the features described herein, or as an alternative, in further embodiments the component of the refrigeration circuit is mechanically and thermally coupled to the second end of the heat sink.

In addition to one or more of the features described herein, or as an alternative, in further embodiments the component of the refrigeration circuit is mechanically and thermally coupled to a central portion of the heat sink.

In addition to one or more of the features described herein, or as an alternative, in further embodiments the heat sink further comprises a body having at least one opening formed therein.

In addition to one or more of the features described herein, or as an alternative, in further embodiments the refrigeration unit is part of a transport refrigeration system.

According to an embodiment, a method of cooling a power electronic device during operation of a refrigeration unit includes circulating refrigerant through a refrigeration circuit and transferring a waste heat from the power electronic device to a portion of the refrigeration circuit to cool the power electronic device.

In addition to one or more of the features described herein, or as an alternative, in further embodiments transferring waste heat from the power electronic device to the portion of the refrigeration circuit further comprises transferring the waste heat from the power electronic device to a mounting plate, transferring the waste heat from the mounting plate to a heat sink, and transferring the waste heat from the heat sink to the portion of the refrigeration circuit.

In addition to one or more of the features described herein, or as an alternative, in further embodiments the refrigeration circuit further comprises an evaporator and a compressor fluidly connected by a suction tube, the waste heat from the from the power electronic device being transferred to the suction tube.

In addition to one or more of the features described herein, or as an alternative, in further embodiments the suction tube further comprises at least one linear section, the waste heat from the from the power electronic device being transferred to the at least one linear section.

In addition to one or more of the features described herein, or as an alternative, in further embodiments a refrigerant within the suction tube is cooler than an operating temperature of the power electronic device.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
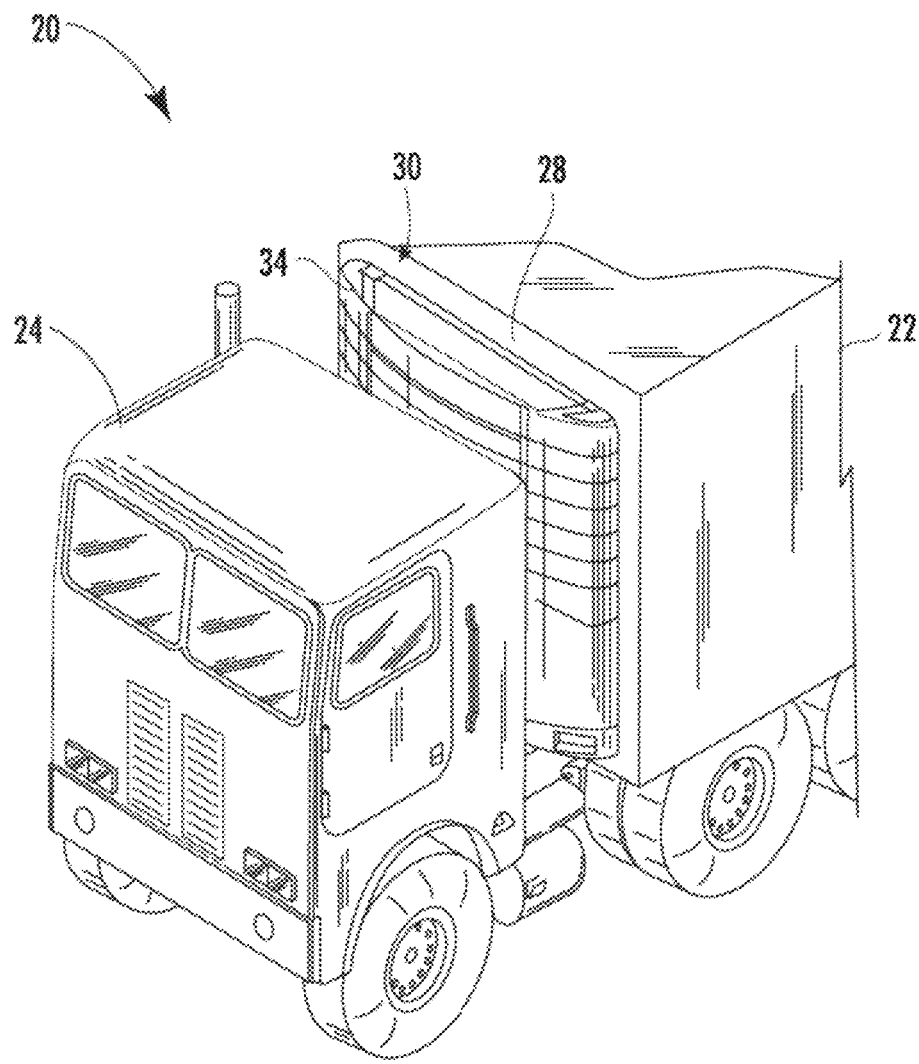
FIG. 1 is a schematic illustration of an exemplary transport refrigeration system according to an embodiment.
Figure 2:
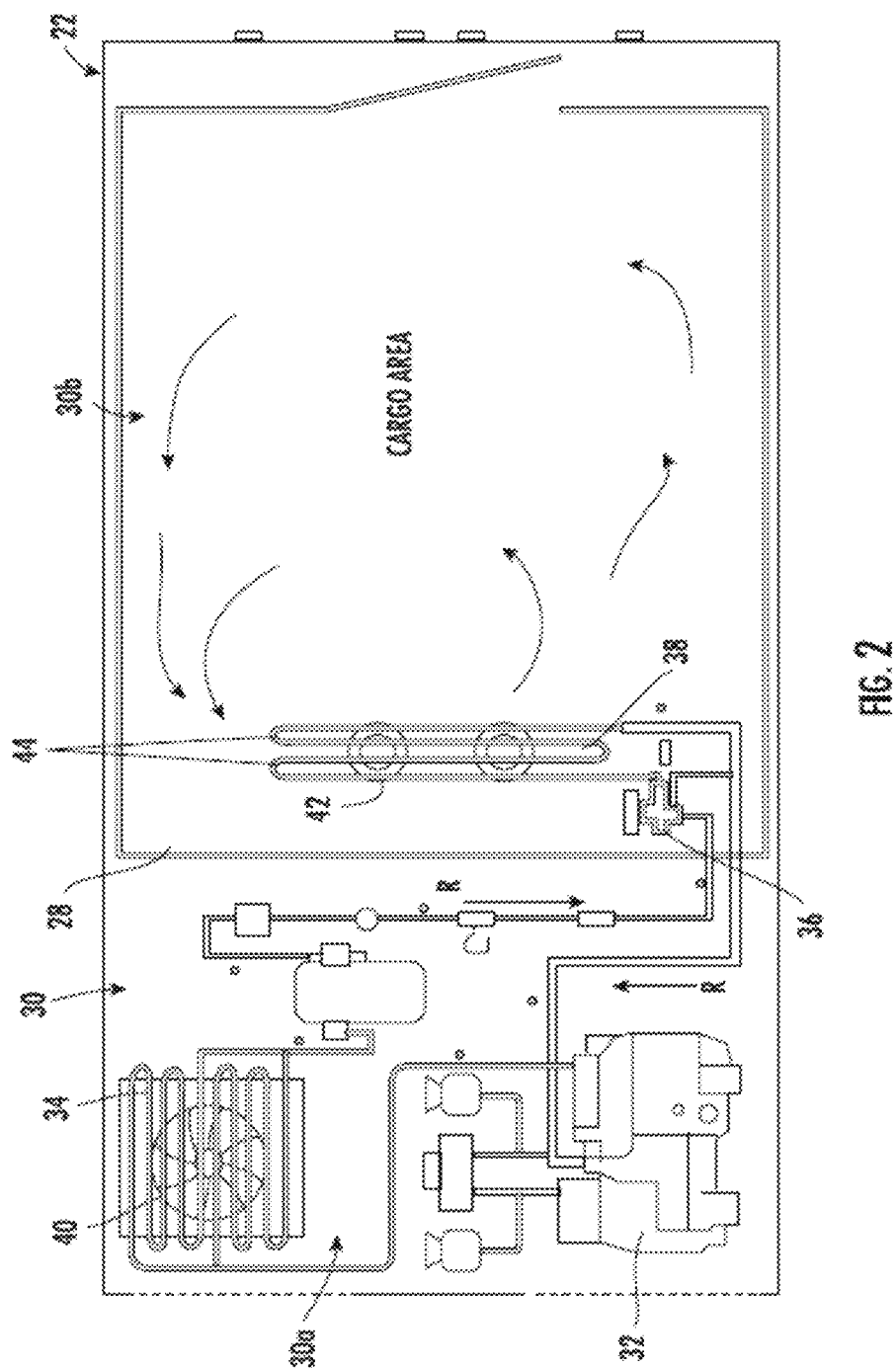
FIG. 2 is a schematic illustration of an exemplary basic refrigeration circuit of a refrigeration unit according to an embodiment.

With reference now to FIGS. 1 and 2, an exemplary transport refrigeration system 20 is illustrated. In the illustrated, non-limiting embodiment, the transport refrigeration system 20 is shown as a trailer system. As shown, the transport refrigeration system 20 includes a trailer or container 22 being towed or otherwise transported by a tractor 24 including an operator's compartment or cab 26 and also including prime mover (not shown), such as an engine or HVDC battery pack, which acts as the drivetrain system of the transport refrigeration system 20. A refrigeration unit 30 is configured to maintain cargo located within the container 22 at a selected temperature by cooling the cargo space of the container 22. As shown, the refrigeration unit 30 may be mounted at the front wall 28 of the container 22. Together, the refrigeration unit 30 and the cargo container 22 may form a refrigerated container system. It should be appreciated by those of skill in the art that embodiments described herein may be applied to any transport refrigeration system such as, for example shipping containers that are shipped by rail, sea (via a watercraft), or any other suitable container, without use of a tractor 24.

With reference to FIG. 2, a basic refrigeration circuit of the refrigeration unit 30 is shown. The refrigeration unit 30 is divided into two sections, a condenser section 30a and an evaporator section 30b. The condenser section 30a may be disposed generally forward of a front wall of the container 22 and is arranged in fluid communication with the ambient atmosphere external to the container 22 and the refrigeration unit 30 to exchange air and heat therewith. The evaporator section 30b is not in fluid communication with the ambient atmosphere to control temperature within the container 22. The refrigeration unit 30 includes a compressor 32, a condenser coil 34, an expansion device 36, and an evaporator coil 38 fluidly connected to one another to form a closed loop system. A fluid R, such as a refrigerant, for example, is configured to flow from the compressor 32 to the condenser coil 34, expansion device 36, and evaporator coil 38 in series. A condenser fan 40, such as driven by a condenser motor (not shown) is configured to move a flow of air across an exterior of the condenser coil 34, and an evaporator fan 42, such as driven by an evaporator motor (not shown), may be used to drive a flow of fluid (air) across an exterior of the evaporator coil 38 and into the portion of the container 22 in which the cargo is located.

Figure 3:
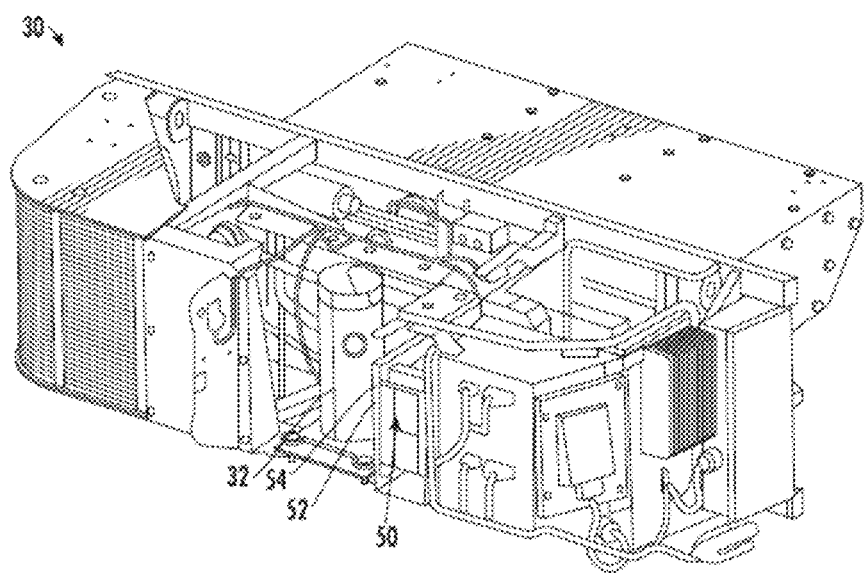
FIG. 3 is a perspective view of a portion of a refrigeration unit according to an embodiment.

At least one power electronic device 50 (see FIG. 3) associated with the compressor 32 may be mounted within the condenser section 30a, such as near or adjacent to the compressor 32, for example. It should be understood that the term "power electronic device" as used herein can refer to any electronic component which can provide a controlled output power by modulating and/or converting a supplied input power (e.g., a variable frequency drive, power rectifier, power converter, and the like). Such a power electronic device 50 can be used to control the speed of a compressor and/or the speed of the fan of a refrigeration system based on various predetermined system conditions. As shown, at least one power electronic device 50 may be mounted to a vertically oriented first surface 52 of a mounting plate 54. However, embodiments where a power electronic device 50 is mounted to a surface having a non-vertical orientation, such as a horizontal surface for example, are also within the scope of the disclosure.

The reliability and life of the one or more power electronic devices 50 can depend upon precluding such electrical components from operating at high temperatures and/or precluding their exposure to thermal shock. During operation of the refrigeration unit 30, the electrical components inside the power electronic devices 50 generate a waste heat. In an embodiment, to maintain the power electronic devices 50 at a suitable temperature, the refrigeration unit 30 includes a heat sink 60 configured to remove heat from the power electronic devices 50. The heat sink 60 may be formed from any suitable thermally conductive material, such as aluminum or copper for example. In an embodiment, the heat sink 60 is formed via an extrusion process. Further, the heat sink 60 may include an insulative material (not shown) arranged over all or at least a portion of an exterior surface thereof.

As shown, a first end 62 of the heat sink 60 is mechanically and thermally coupled to a second, opposite surface 56 of the mounting plate 54, such as the surface opposite the surface 52 to which the power electronic devices 50 are connected. Although the heat sink 60 is illustrated as extending substantially orthogonal to the surface 56 of the mounting plate 54, embodiments where all or a portion of the heat sink 60 extends at another angle are also contemplated herein.

Figure 5A:
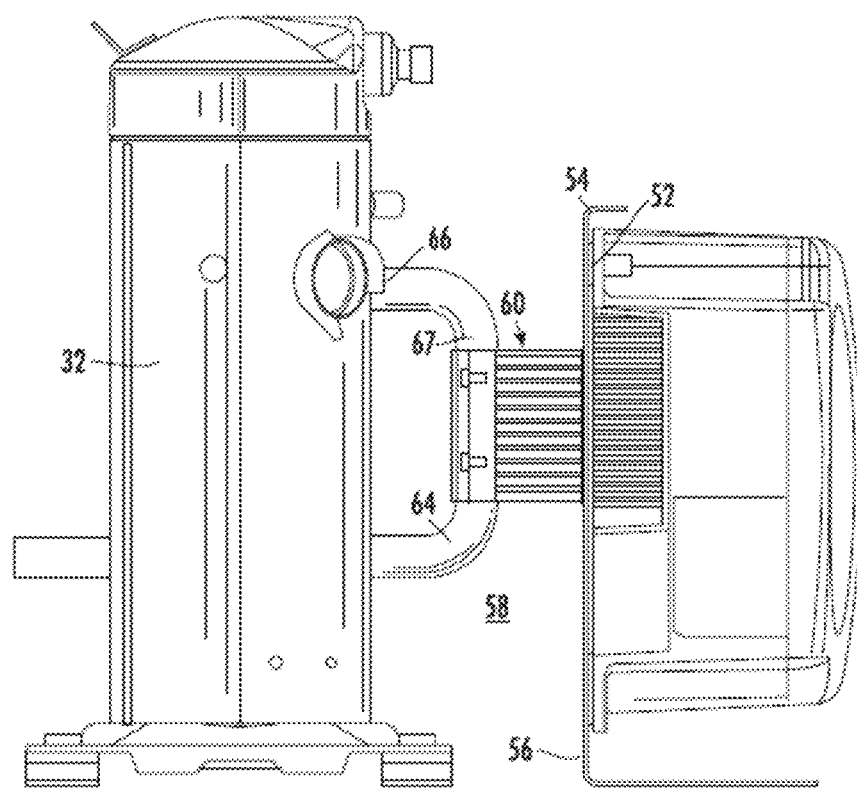
FIG. 5A is a side view of a portion of a refrigeration unit including an exemplary heat sink according to an embodiment.
Figure 5B:
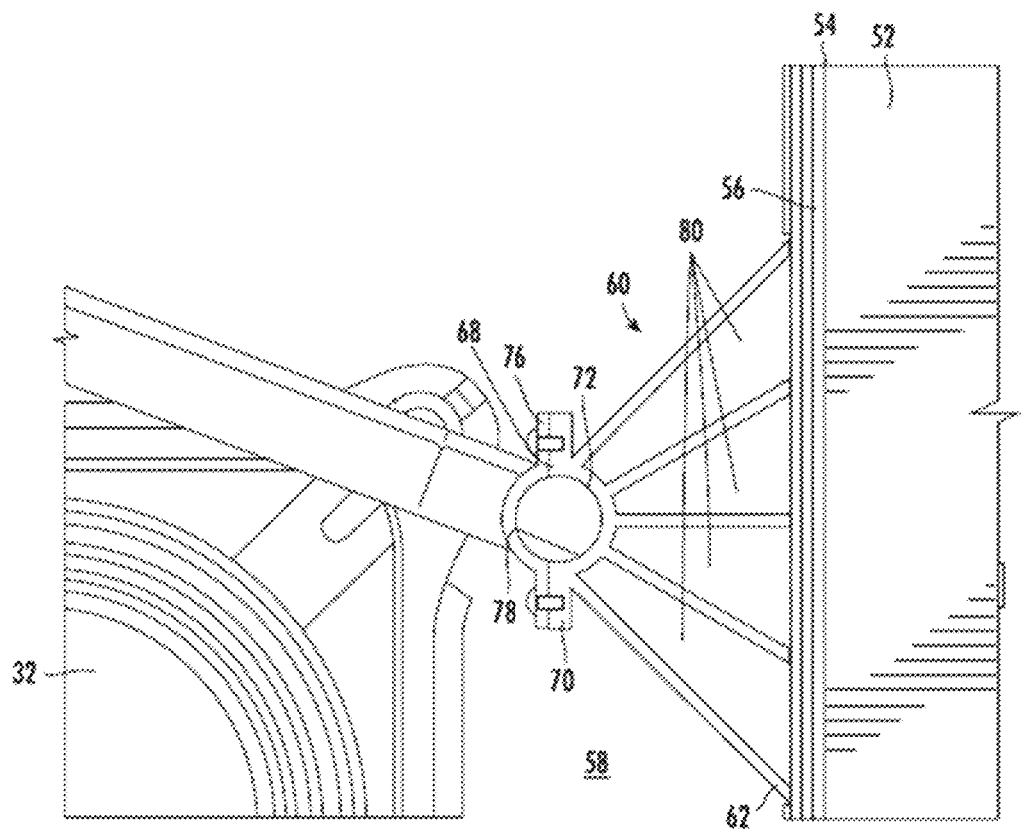
FIG. 5B is a plan view of the heat sink shown in FIG. 5A according to an embodiment.

In an embodiment, the first end 62 of the heat sink 60 is mounted in overlapping arrangement with the surface 56 of the mounting plate 54. However, in other embodiments, at least a portion of the first end 62 of the heat sink 60 is receivable within at least one recess or groove 82 (see FIG. 5B) formed in the surface 56 of the mounting plate 54. Further, a material, such as thermal grease for example, may be arranged at the interface between the heat sink 60 and the mounting plate 54 to facilitate heat transfer away from the mounting plate 54 to the heat sink 60, and therefore away from the power electronic devices 50. Although the mounting plate 54 is described as a plate, it should be understood that in an embodiment, the mounting plate may be a housing having an internal flow path for a cooling fluid such that the mounting plate functions as a heat exchanger.

In an embodiment, the heat sink 60 is configured to transfer heat from the power electronic devices 50 via the mounting plate 54 to another component within the condenser section 30a. As best shown in FIGS. 4A-5B, a clearance 58 is defined between the compressor 32 and the surface 56 of the mounting plate 54. A conduit 64, also referred to herein as the "suction tube", fluidly connecting the suction inlet 66 of the compressor 32 with an upstream component, such as an outlet of the evaporator coil 38 for example, is arranged at least partially within the clearance 58. In the illustrated, non-limiting embodiment, the heat sink 60 is mechanically and thermally coupled to a portion of the suction tube 64. During operation of the refrigeration unit 30, the temperature of the suction tube 64 (which may be considered equivalent to the temperature of the refrigerant within the suction tube 64) is much lower than the operating temperature of the one or more power electronic devices 50. Accordingly, a heat sink 60 arranged in thermal communication with both the mounting plate 54 and the suction tube 64 will facilitate enhanced cooling of the power electronic devices 50.

In the illustrated, non-limiting embodiment, the heat sink 60 is coupled to a linear section 67 of the suction tube 64. The linear section 67 of the suction tube 64 may be vertically oriented (as shown), or alternatively, may arranged parallel to or at an angle to the surface 56 of the mounting plate 54. A height of the heat sink 60, measured parallel to the axis of the linear section 67 of the suction tube 64 to which the heat sink 60 is coupled, may be substantially equal to, or may be less than the length of the corresponding linear section 67 of the suction tube 64. As shown, the suction tube 64 includes a single linear section 67 arranged within the clearance 58. However, it should be understood that a suction tube 64 having a tortuous path including a plurality of linear sections arranged within the clearance 58 is also contemplated herein. In such embodiments, the heat sink 60 may be configured to couple to at least one linear section of the plurality of linear sections 67 of the suction tube 64 depending on the desired heat dissipation. Accordingly, the configuration of the suction tube 64 within the clearance 58 and/or the total surface area over which the heat sink 60 is arranged in contact with the suction tube 64 may be selected based on the temperature demands of the power electronic devices 50 of a specific application.

As shown, the second end 68 of the heat sink 60 is connected to the suction tube 64. In an embodiment, the second end 68 of the heat sink 60 includes a flange 70 having a recess or groove 72 complementary to a contour of a portion of the suction tube 64. A mounting bracket 74 having a similar flange 76 and a recess 78 for receiving a portion of the suction tube 64 therein may be connectable with the flange 70 of the heat sink 60, such as via a plurality of fasteners for example, to affix the heat sink 60 to the suction tube 64. Although the second end 68 of the heat sink 60 is shown in the illustrated, non-limiting embodiments as being coupled to the suction tube 64, it should be understood that embodiments where the suction tube 64 is arranged at another location relative to the heat sink 60, such as at a central portion of the heat sink 60 for example, are also contemplated herein.

Figure 4A:
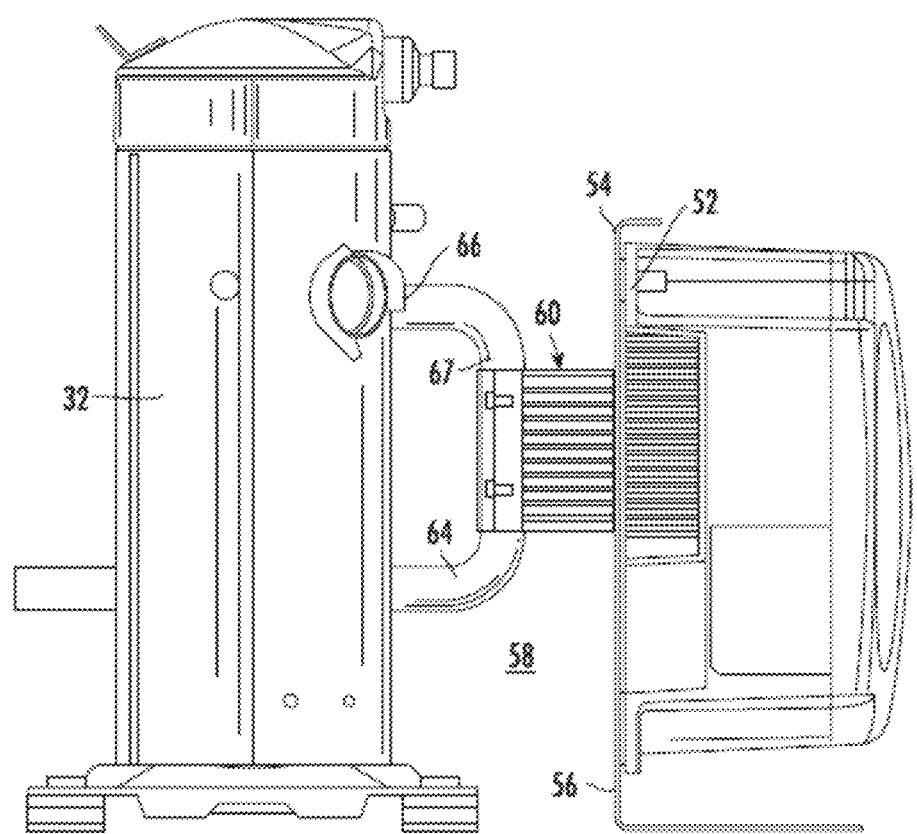
FIG. 4A is a side view of a portion of a refrigeration unit including an exemplary heat sink according to an embodiment.
Figure 4B:
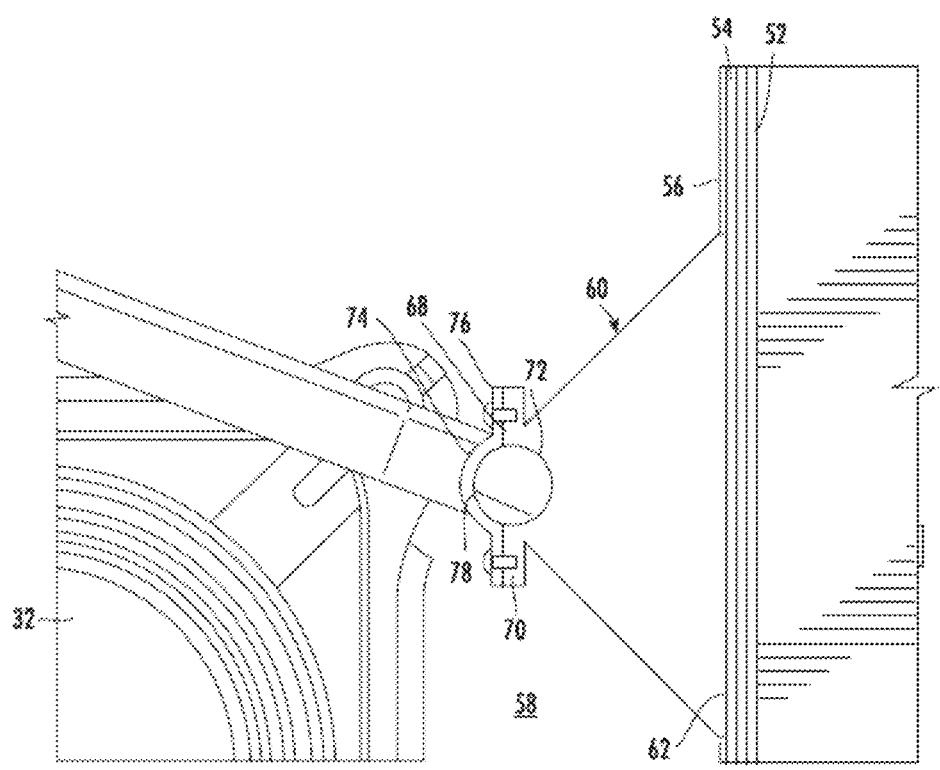
FIG. 4B is a plan view of the heat sink shown in FIG. 4A according to an embodiment.

In an embodiment, a width of the heat sink 60 at the first end 62, measured in plane perpendicular to the length of the heat sink 60, is substantially larger than a width of the heat sink 60 at the second end 68 thereof. The heat sink 60 may be formed having a generally solid body, as shown in FIGS. 4A and 4B. However, in other embodiments, the heat sink 60 may have one or more openings 80 formed therein to reduce the total material and weight of the heat sink 60, while maintaining the necessary heat transfer from the mounting plate to the suction tube 64. The openings 80 formed in the heat sink 60 may extend along one or more of the length and width of the heat sink 60. As a result of the openings 80, the body of the heat sink 60 may have a finned configuration. For example, in the illustrated, non-limiting embodiment of FIGS. 5A and 5B, the first end 62 of the heat sink 60 is not a continuous surface, but rather is defined by the ends of a plurality of fins, at least one of which is in contact with the mounting plate 54.

Inclusion of a heat sink 60 as described herein will enhance the cooling of the power electronic devices of the refrigeration unit, thereby improving component performance, reliability, and life. In addition, transferring the waste heat from the power electronics devices to the refrigerant in the suction tube 64 may also extend the range of ambient operation of the refrigeration unit 30.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A refrigeration unit comprising:
   a refrigeration circuit including a compressor having a suction tube fluidly connected to an inlet of the compressor;
   a mounting plate having a first surface and an opposite, second surface, a clearance being defined between the compressor and the second surface and a portion of the suction tube being arranged within the clearance;
   a power electronics device thermally coupled to the first surface of the mounting plate;
   a heat sink having a first end thermally and mechanically coupled to the mounting plate and having a second end thermally and mechanically coupled to the portion of the suction tube arranged within the clearance, wherein the heat sink is configured to transfer waste heat from the mounting plate to the suction tube.

2. The refrigeration unit of claim 1, wherein the suction tube includes at least one linear section and the heat sink is thermally coupled to the at least one linear section.

3. The refrigeration unit of claim 2, wherein the at least one linear section is oriented parallel to the mounting plate.

4. The refrigeration unit of claim 2, wherein the at least one linear section is vertically oriented.

5. The refrigeration unit of claim 1, wherein the suction tube includes a plurality of linear sections and the heat sink is thermally coupled to at least one of the plurality of linear sections.

6. The refrigeration unit of claim 1, wherein the surface of the mounting plate has at least one recess formed therein and the first end of the heat sink is arranged within the at least one recess.

7. The refrigeration unit of claim 1, wherein the suction tube is mechanically and thermally coupled to a central portion of the heat sink.

8. The refrigeration unit of claim 1, wherein the heat sink further comprises a body having at least one opening formed therein.

9. The refrigeration unit of claim 1, wherein the refrigeration unit is part of a transport refrigeration system.

10. A method of cooling a power electronic device during operation of a refrigeration unit, the method comprising:
   circulating refrigerant through a refrigeration circuit, the refrigeration circuit including a power electronic device thermally coupled to a first surface of a mounting plate and a compressor having a suction tube fluidly connected to an inlet of the compressor, wherein a clearance is defined between the compressor and an opposite second surface of the mounting plate, a portion of the suction tube being arranged within the clearance; and
   transferring waste heat from the power electronic device to a portion of the refrigeration circuit to cool the power electronic device via the heat sink, the heat sink having a first end thermally and mechanically coupled to the second surface of the mounting plate and having a second end thermally and mechanically coupled to the portion of the suction tube arranged within the clearance.

11. The method of claim 10, wherein transferring waste heat from the power electronic device to the portion of the refrigeration circuit further comprises:
   transferring the waste heat from the power electronic device to the mounting plate;
   transferring the waste heat from the mounting plate to the heat sink; and
   transferring the waste heat from the heat sink to the portion of the refrigeration circuit.

12. The method of claim 11, wherein the refrigeration circuit further comprises an evaporator fluidly connected to the compressor via the suction tube.

13. The method of claim 11, wherein the suction tube further comprises at least one linear section, the waste heat from the from the power electronic device being transferred to the at least one linear section.

14. The method of claim 11, wherein a refrigerant within the suction tube is cooler than an operating temperature of the power electronic device.

* * * * *